(12) United States Patent
Takemura

(10) Patent No.: US 8,599,604 B2
(45) Date of Patent: Dec. 3, 2013

(54) SEMICONDUCTOR MEMORY DEVICE AND DRIVING METHOD THEREOF

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 127 days.

(21) Appl. No.: 13/276,351

(22) Filed: Oct. 19, 2011

(65) Prior Publication Data

US 2012/0099360 A1   Apr. 26, 2012

(30) Foreign Application Priority Data

Oct. 25, 2010   (JP) ................................. 2010-238609

(51) Int. Cl.
    *G11C 11/00*   (2006.01)
(52) U.S. Cl.
    USPC .............................. 365/154; 365/72; 365/205
(58) Field of Classification Search
    USPC .......................................... 365/154, 205, 72
    See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,141,835 B2 * | 11/2006 | Kihara ........................... | 257/208 |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Son Dinh
*Assistant Examiner* — Nam Nguyen
(74) *Attorney, Agent, or Firm* — Fish & Richardson P.C.

(57) ABSTRACT

In a memory cell, a transistor with extremely high off-resistance is used as a write transistor; a drain and a source of the write transistor are connected to a write bit line and an input of an inverter, respectively; and a drain and a source of a read transistor are connected to a read bit line and an output of the inverter, respectively. Capacitors may be intentionally disposed to the source of the write transistor. Alternatively, parasitic capacitance may be used. Since the data retention is performed using charge stored on these capacitors, a potential difference between power sources for the inverter can be 0. This eliminates leakage current between the positive and negative electrodes of the inverter, thereby reducing power consumption.

20 Claims, 12 Drawing Sheets

(56) References Cited

U.S. PATENT DOCUMENTS

| | | |
|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,199,594 B2 * | 6/2012 | Takeda .................... 365/205 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0274124 A1 | 11/2007 | Otsuka |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0175646 A1 | 7/2011 | Takemura et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

(56) References Cited

OTHER PUBLICATIONS

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT, " SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5') Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(56) References Cited

OTHER PUBLICATIONS

Wonchan Kim et al.; An Experimental High-Density DRAM Cell with a Built-in Gain Stage; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Kiyoshi Takeuchi et al.; "Channel Engineering for the Reduction of Random-Dopant-Placement-Induced Threshold Voltage Fluctuation"; IEDM 97: Technical Digest of International Electron Devices Meeting; Dec. 7, 1997; pp. 841-844.

Ohara, H et al., "Amorphous In-Ga-Zn-Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

SEMICONDUCTOR MEMORY DEVICE AND DRIVING METHOD THEREOF

BACKGROUND OF THE INVENTION

1. Field of the Invention

The present invention relates to a memory device using a semiconductor.

2. Description of the Related Art

A static random access memory (an SRAM) using two inverters for its memory cell operates at high speed, and thus is used to temporarily store programs and/or data either in the CPU or in a part near the CPU. Unlike a dynamic random access memory (a DRAM), the SRAM does not require to be refreshed while storing data, thereby consuming less power in standby mode. For this reason, the SRAM is also used for data storage in a portable device.

FIG. 2A illustrates a conventional SRAM memory cell. The memory cell is connected to two bit lines BL1 and BL2 and one word line WL. The memory cell includes two selection transistors STr1 and STr2 and two inverters INV1 and INV2. The gates of the selection transistors STr1 and STr2 are connected to the word line WL. The drain of the selection transistor STr1 is connected to the bit line BL1, and the drain of the selection transistor STr2 is connected to the bit line BL2.

The source of the selection transistor STr1 is connected to the output of the INV1 and the input of the INV2. The source of the selection transistor STr2 is connected to the output of the INV2 and the input of the INV1. In other words, the output of the inverter INV1 is connected to the input of the inverter INV2, and the output of the inverter INV2 is connected to the input of the inverter INV1. A circuit in which two inverters are connected to each other in this way is called a flip-flop circuit.

Complementary inverters are used as these inverters to achieve low power consumption. In a complementary inverter, the gate of the p-type transistor and the gate of the n-type transistor are connected to each other, serving as the input of the inverter. Moreover, the drain of the p-type transistor and the drain of the n-type transistor are connected to each other, serving as the output of the inverter. Further, the potential of the source of the p-type transistor (the positive electrode of the inverter) is held high (VDD), and the potential of the source of the n-type transistor (the negative electrode of the inverter) is held low (VSS).

The normal characteristics of the complementary inverter are illustrated in FIG. 2B. Here, the threshold voltage of the n-type transistor is denoted by Vth_N, and the threshold voltage of the p-type transistor is denoted as Vth_P. If input potential VIN is between VSS and (VSS+Vth_N), output potential VOUT becomes potential VDD. If input potential VIN is between (VDD−|Vth_P|) and VDD, output potential VOUT becomes potential VSS.

If input potential VIN is between (VSS+Vth_N) and (VDD−|Vth_P|), both the p-type transistor and the n-type transistor are on, and output potential VOUT is determined by the resistance ratio therebetween. Since both the p-type transistor and the n-type transistor are on, relatively high current called flow-through current flows between the positive and negative electrodes of the inverter.

In order to write data into the SRAM memory cell, an appropriate potential is applied to the word line WL to turn on the selection transistors STr1 and STr2 and, while the selection transistors STr1 and STr2 are on, potentials according to the data are applied to the bit lines BL1 and BL2, where the phase of the potentials are opposite each other. For example, potential VDD is applied to the bit line BL1, and potential VSS is applied to the bit line BL2.

Consequently, the output of the inverter INV1 becomes potential VSS, and the output of the inverter INV2 becomes potential VDD. Each of these outputs has the same potential as the bit line connected to the output of the inverter through the selection transistor (STr1 or STr2). This potential is input to the other inverter. Thus, the flip-flop circuit goes into a stable state.

In order to read data, an appropriate potential is applied to the word line WL to turn on the selection transistors STr1 and STr2 and, while these transistors are on, changes in the potentials of the bit lines are monitored. Here, if the on-resistances of the selection transistors STr1 and STr2 are too low, the output potentials of the inverters are affected by the potential of the bit line, so that the flip-flop circuit becomes unstable, which may results in loss of data.

Therefore, the following measures are taken to avoid instability: the potentials of the bit lines are set between VDD and VSS in advance to turn on the selection transistors STr1 and STr2; and/or the on-resistances of the selection transistors STr1 and STr2 are set approximately equal to or higher than or equal to the on-resistances of the transistors forming the inverters.

By the way, in resent years, a reduction in the difference between potential VDD and potential VSS (lower voltage operation) is required to further reduce power consumption. The inverter characteristics shown in FIG. 2B are those obtained when VDD−VSS>Vth_N+|Vth_P|, whereas the inverter characteristics shown by the solid line in FIG. 2C are those obtained when lower voltage operation is achieved, so that VDD−VSS<Vth_N+|Vth_P|.

Here, if input potential VIN is between VSS and (VDD−|Vth_P|), output potential VOUT becomes potential VDD. If input potential VIN is between (VSS+Vth_N) and VDD, output potential VOUT becomes potential VSS.

If input potential VIN is between (VDD−|Vth_P|) and (VSS+Vth_N), both of the p-type and n-type transistors are off, and output potential VOUT is determined by the resistance ratio therebetween. However, since both of them have high resistance, output potential VOUT in this region is extremely unstable and fails to respond in short time.

For example, even if input potential VIN is apparently slightly higher than (VDD−|Vth_P|), output potential VOUT is almost VDD. This is because the resistance of the p-type transistor is relatively lower than that of the n-type transistor, and both of the transistors are in the subthreshold states. In other words, the resistance of the p-type transistor here is several to dozens of times that obtained when input potential VIN is (VDD−|Vth_P|). Therefore, when a load is connected to the output of the inverter, output potential of the inverter may drastically change regardless of the input of the inverter.

For this reason, input potential VIN that produces a stable output of VDD or VSS is limited to the range from VSS to (VDD−|Vth_P|) and the range from (VSS+Vth_N) to VDD. For example, each of these ranges has a width of only 0.2 V in the case where VDD=+0.8 V, VSS=0 V, Vth_P=−0.6 V, and Vth_N=+0.6 V. In contrast, in the case shown in FIG. 2B, since VDD−VSS=1.6 V, each of the ranges has a width of as large as 0.6 V in which output potential VOUT becomes VDD or VSS.

In addition, as a result of the miniaturization of the transistors, statistical fluctuations of impurity concentrations in the channels have became nonnegligible, which poses the problems of threshold voltage variations among the transistors (Non-Patent Document 1). Consequently, characteristics variations among inverters using transistors with a channel length of 0.1 μm or less have been increased. This has further narrowed the range of actually available input potential VIN.

For example, if Vth_P=−0.7 V and Vth_N=+0.7 V, input potential VIN that can be used in a stable state is in the range from 0V to +0.1 V and in the range from +0.7V to +0.8V each of which has a width of only 0.1 V.

If Vth_P=−0.7 V and Vth_N=+0.5 V, input potential VIN that can be used in a stable state is in the range from 0 V to +0.1 V and the range from +0.5 V to +0.8 V which provide a width of 0.4 V in total. However, the ranges have different permissible widths; hence, in the flip-flop circuit using the output of one inverter as the input of the other inverter, substantially permissible input potential VIN is in the range from 0 V to +0.1 V and the range from +0.7 V to +0.8 V each of which has a width of 0.1 V.

The characteristics shown in FIGS. 2B and 2C are those in a steady state; the range of actually available input potential VIN is further narrowed when used for a short period, e.g., that for write or read operation in the memory.

Moreover, the lower voltage operation poses the problem of decreasing the writing or reading speed caused by the increase of on-resistance of the on-state transistor included in the inverter. In order to avoid these problems, a method, for example, of controlling the potential of the power sources for the inverter has been proposed (see Patent Document, 1 for example). In this method, the potential of the power sources for the inverter is changed in accordance with data during the write operation.

In the data retention state, the amount of current flowing through the inverter (current flowing from the positive electrode of the inverter to the negative electrode of the inverter) is determined by the resistance of the transistor in the off-state. In this state, a transistor with a normal threshold voltage has an off-resistance of $1\times10^{13}\Omega$, or more. Hence, the leakage current of one inverter is $1\times10^{-13}$ A or less. For example, one gigabit memory has as many as two billion or more inverters, resulting in consumption of current of as much as $2\times10^{-4}$ A.

If threshold voltage variations increase as described above as a result of the miniaturization, the number of the transistors having low off-resistances among those forming the inverters increases. A drop of 0.1 V in threshold voltage reduces the off-resistance by a factor of about 30 and increases the leakage current by a factor of about 30. In addition, short-channel effect raises the subthreshold value of the transistors, which may reduce the off-resistance.

Reducing gate insulator thickness can reduce short channel effect or statistical variations in impurity concentration; however, an excessive reduction in gate insulator thickness may increase leakage current between the gate and the channel.

In other words, a highly integrated SRAM has a higher leakage current per one bit than the conventional one, and high integration causes the SRAM in which one chip has a greater number of memory cells to have a higher leakage current for the data retention. However, no effective method has been proposed to reduce such leakage current of the data retention period.

REFERENCE

Patent Document

[Patent Document 1] United States Published Patent Application No. 2007/0274124
[Patent Document 2] United States Published Patent Application No. 2011/0089417
[Patent Document 3] United States Published Patent Application No. 2011/0101332

Non-Patent Document

[Non-Patent Document 1] K. Takeuchi et al. "Channel Engineering for the Reduction of Random-Voltage-Induced Threshold Voltage Variation", p. 841, IEDM, 1997

SUMMARY OF THE INVENTION

An object of one embodiment of the present invention is to provide a semiconductor memory device with less power consumption at the time of data retention. Another object of one embodiment of the present invention is to provide a semiconductor memory device in which read or write time can be shortened. Another object of one embodiment of the present invention is to provide a memory device having a novel structure and a driving method thereof, particularly, a memory device or the driving method thereof that can reduce power consumption.

Terms used in this specification will now be briefly described before describing the present invention below. First, when one of the source and the drain of a transistor is called a drain, the other is called a source in this specification. In other words, they are not distinguished depending on the potential level. Therefore, a portion called a source in this specification can be called a drain, instead.

The term "connect" used in this specification indicates that, in the actual circuit, there is no physical connecting point while a wire may be just extended. In a circuit with an insulated-gate field-effect transistor (MISFET), for example, one wire may serve as the gates of a plurality of MISFETs. In some cases, this is shown in the circuit diagram as one wire divided into several branches going to the gates. Even in these cases, the expression "a wire is connected to a gate" may be used in this specification.

Note that in this specification, in order to indicate a specific row, column, or location in a matrix, a reference numeral accompanied by a sign denoting the coordinates is used, for example, as follows: "a write transistor WTr_n_m", "a bit line BL_m", and "an inverter INV_n_m". In the case where the row, column, and position are not specified, the case where they are treated collectively, or the case where their locations are obvious, the following expressions may be used: "a write transistor WTr", "a bit line BL", and "an inverter INV" or simply "a write transistor", "a bit line", and "an inverter".

One embodiment of the present invention is a semiconductor memory device including: one or more bit lines; one or more write word lines; one or more read word lines; and one or more memory cells. The memory cell comprises a write transistor, a read transistor, and an inverter. A maximum resistance of the write transistor is $1\times10^{18}\Omega$ or more, preferably $1\times10^{24}\Omega$ or more. A drain of the write transistor is connected to one of the bit lines. A drain of the read transistor is connected to the one of the bit lines or another of the bit lines. A source of the write transistor is connected to an input of the inverter. A source of the read transistor is connected to an output of the inverter. A gate of the write transistor is connected to the write word line. A gate of the read transistor is connected to the read word line.

One embodiment of the present invention is a driving method of the semiconductor memory device having the above-stated structure, in which, after the write operation, a potential difference between the positive and negative electrodes of the inverter is 0.1 V or less, preferably 0.001 V or less.

One embodiment of the present invention is a driving method of the semiconductor memory device having the above-stated structure, in which, a potential applied to the input of the inverter is higher than the potential of the positive electrode of the inverter, or lower than the potential of the negative electrode of the inverter.

The source of the write transistor may be connected to one electrode of a capacitor. The inverter may be a complementary inverter. The conductivity type of the read transistor may be different from that of the write transistor. The read transistor may be a p-channel transistor.

The write transistor and the read transistor may be disposed in different layers. The write transistor and one of the transistors forming the inverter may be disposed in different layers. Alternatively, one of the transistors forming the inverter and the other may be disposed in different layers.

A semiconductor for the write transistor and a semiconductor for the read transistor may be of different kinds. A semiconductor for the write transistor and a semiconductor for one of the transistors forming the inverter may be of different kinds. Alternatively, a semiconductor for the write transistor and a semiconductor for the read transistor may be of the same kinds. A semiconductor for the write transistor and a semiconductor for one of the transistors forming the inverter may be of the same kinds.

By employing any of the above-described structures, at least one of the above-described objects can be achieved. Examples of the effects of the present invention will be described using comparison with a conventional SRAM, with reference to FIG. 1. The circuit illustrated in FIG. 1 is one of the technical ideas of one embodiment of the present invention. FIG. 1 shows four memory cells: a memory cell in the n-th row and m-th column, a memory cell in the (n+1)-th row and m-th column, a memory cell in the n-th row and the (m+1)-th column and a memory cell in the (n+1)-th row and (m+1)-th column. The memory cell may be denoted by "MC", or the memory cell in the n-th row and the (m+1)-th column may be denoted by "MC_n_m" in the figures. Each memory cell includes one inverter INV, a write transistor WTr, and a read transistor RTr.

The source of the write transistor WTr is connected to one electrode of a capacitor C1 and one electrode of a capacitor C2. The other electrode of the capacitor C1 is connected to the positive electrode of the inverter. The other electrode of the capacitor C2 is connected to the negative electrode of the inverter. Note that the capacitor C1 or the capacitor C2, or both may be provided unintentionally.

The gate capacitance of the inverter INV and the parasitic capacitance of other wires are added to the source of the write transistor WTr. Such capacitance (including the parasitic capacitance) including that of the capacitors C1 and C2 are, in total, $1 \times 10^{-16}$ F or less, preferably $1 \times 10^{-17}$ F or less. Note that such capacitance is hereinafter collectively called capacitance connected to the source of the write transistor WTr and the capacitors having such capacitance are hereinafter collectively called a capacitor connected to the source of the write transistor WTr.

Note that the read transistor RTr may be of the same conductivity type as or a different conductivity type from the write transistor WTr. For example, both the write transistor WTr and the read transistor RTr may be n-type transistors. Alternatively, the write transistor WTr and the read transistor RTr may be an n-type transistor and a p-type transistor, respectively.

During the write operation, the potential of a write word line WWL is set to an appropriate value to turn on the write transistor WTr, and at the same time, the potential of a write bit line WBL is set according to data, so that the potential of the source of the write transistor WTr and the capacitor connected to it becomes close to the potential of the write bit line WBL.

Next, the potential of the write word line WWL is set to an appropriate value, thereby making the resistance of the write transistor WTr extremely high. In other words, the resistance of the write transistor WTr is set to $1 \times 10^{18} \Omega$ or more, preferably $1 \times 10^{24} \Omega$ or more. In this state, the potential of the source of the write transistor WTr is varied by the time constant which is determined by the capacitance connected to the source of the write transistor WTr and the resistance of the write transistor WTr.

For example, the time constant is $1 \times 10^7$ seconds=115 days when the resistance of the write transistor WTr is $1 \times 10^{24} \Omega$ and the capacitance connected to the source of the write transistor WTr is $1 \times 10^{-17}$ F. In other words, the potential of the source of the write transistor WTr is hardly varied even after 10 days.

A semiconductor material for the write transistor WTr that satisfies these conditions has a bandgap of three electron volts or more and a donor or acceptor concentration of $1 \times 10^{12}$ cm$^{-3}$ or less. Examples of the material include a compound of a metal element and oxygen where one of indium, zinc, and gallium accounts for 20% or more of the metal elements.

For the conventional SRAM, during the write operation, particularly in case of the use of transistors with considerable threshold voltage variations, a longer time than the write time for the ideal SRAM (ignoring the threshold voltage variations) is required until the flip-flop circuit transits into a stable state.

In contrast, for the semiconductor memory device illustrated in FIG. 1, the write time refers to the time until the potential of the source of the write transistor WTr reaches a needed value and is about 10 times the time constant based on the on-resistance of the write transistor WTr and the capacitance connected to the source of the write transistor WTr. It is unnecessary to consider the time required for the inverter INV to be stable.

In the conventional SRAM, since the output of one inverter is the input of the other inverter, the write operation results in failure if the characteristics of these two inverters are not in a given range. Meanwhile, in the semiconductor memory device in FIG. 1, since the output of one inverter is not used for another inverter, probability of failure of the write operation is extremely low even with characteristics variations among the inverters.

For the semiconductor memory device in FIG. 1, in the data retention period, setting the potential difference between the positive and negative electrodes of the inverter to 0.1 V or less, preferably to 0.001 V or less, can dramatically reduce leakage current between the positive and negative electrodes of the inverter. For the conventional SRAM, since the flip-flop circuit needs to hold its state, the potential difference between the positive and negative electrodes of the inverter cannot be less than or equal to the threshold voltage (or the absolute value of the threshold voltage) of the transistors forming the inverter, or if this happens, data are lost.

Reducing the absolute value of the threshold voltage of the transistors can reduce the potential difference between the positive and negative electrodes of the inverter but also increases the off-state current of the transistors, thereby increasing power consumption while data are retained. This disables the use of the SRAM for mobile devices such as cellular phones. In reality, considering the threshold voltage variations, it is impossible to set the potential difference between the positive and negative electrodes of the inverter to 0.8 V or less.

The leakage current of one memory cell in the conventional SRAM (where the potential difference between the positive and negative electrodes of the inverter is 0.8 V) is approximately $1\times10^{-13}$ A. In contrast, the leakage current of one memory cell in the semiconductor memory device in FIG. 1 (where the potential difference between the positive and negative electrodes of the inverter is 0.1 V) is lower than the conventional one by about one order of magnitude, and, when the potential difference between the positive and negative electrodes of the inverter is 0.001 V, by about three orders of magnitude. In an ideal state where the positive and negative electrodes of the inverter have the same potential, there is no leakage current.

During the read operation, one embodiment of the present invention produces remarkable effects. For example, as described above, the conventional SRAM is subject to, during the read operation, many limitations for preventing the potentials of the bit lines from adversely affecting the flip-flop circuit. For the semiconductor memory device in FIG. 1, the potentials of the read bit lines RBL hardly affect the data retention of the memory cells, which means most of such limitations is unnecessary.

For example, the on-resistance of the read transistor can be reduced as much as possible. This enables high-speed read operation. Further, it is unnecessary to set in advance the bit lines at constant potentials. Setting the bit lines at constant potentials in advance needs time and power consumption. Therefore, eliminating the need for this operation leads to higher-speed read operation and lower power consumption.

Note that, as seen in the diagram, one memory cell of the semiconductor memory device in FIG. 1 includes four transistors. Consequently, the semiconductor memory device in FIG. 1 can be integrated with higher density than that for the conventional SRAM which needs six transistors for one memory cell.

When the above-stated compounds of metal elements and oxygen (oxides) are used as semiconductor materials for the write transistor WTr, the semiconductor layer can be made thin. For this reason, a three-dimensional arrangement in which the write transistor WTr is disposed over another transistor included in the memory cell can reduce the area occupied by the memory cell. Needless to say, it is also acceptable that a semiconductor in a transistor other than the write transistor WTr is made thin to provide a three dimensional arrangement, and the integration density is thereby increased.

See Patent Document 2 or Patent Document 3 for a semiconductor device employing a combination of a transistor using an oxide as its semiconductor material (particularly a transistor that gives an extremely high resistance when being in the off-state) and a transistor using a semiconductor other than oxides.

DETAILED DESCRIPTION OF THE INVENTION

Hereinafter, embodiments will be described with reference to drawings. Note that the embodiments can be implemented in various different ways. It will be readily appreciated by those skilled in the art that modes and details of the embodiments can be changed in various ways without departing from the spirit and scope of the present invention. Therefore, the present invention should not be construed as being limited to the description of the embodiments.

Note that specific values are given below as potentials for the purpose of aid for understanding a technical idea of the present invention. Needless to say, such values are changed in accordance with various characteristics of transistors, capacitors, or the like, or for convenience of the practitioner. Further, the semiconductor memory device in embodiments below can write or read data using a method other than a method described below.

Embodiment 1

In this embodiment, the semiconductor memory device in FIG. 1 and an operational example thereof will be described with reference to FIGS. 3A to 3F. A semiconductor device in this embodiment includes write word lines WWL, read word lines RWL, write bit lines WBL orthogonal to the write word lines, read bit lines RBL orthogonal to the read word lines, and memory cells.

Figure 1:
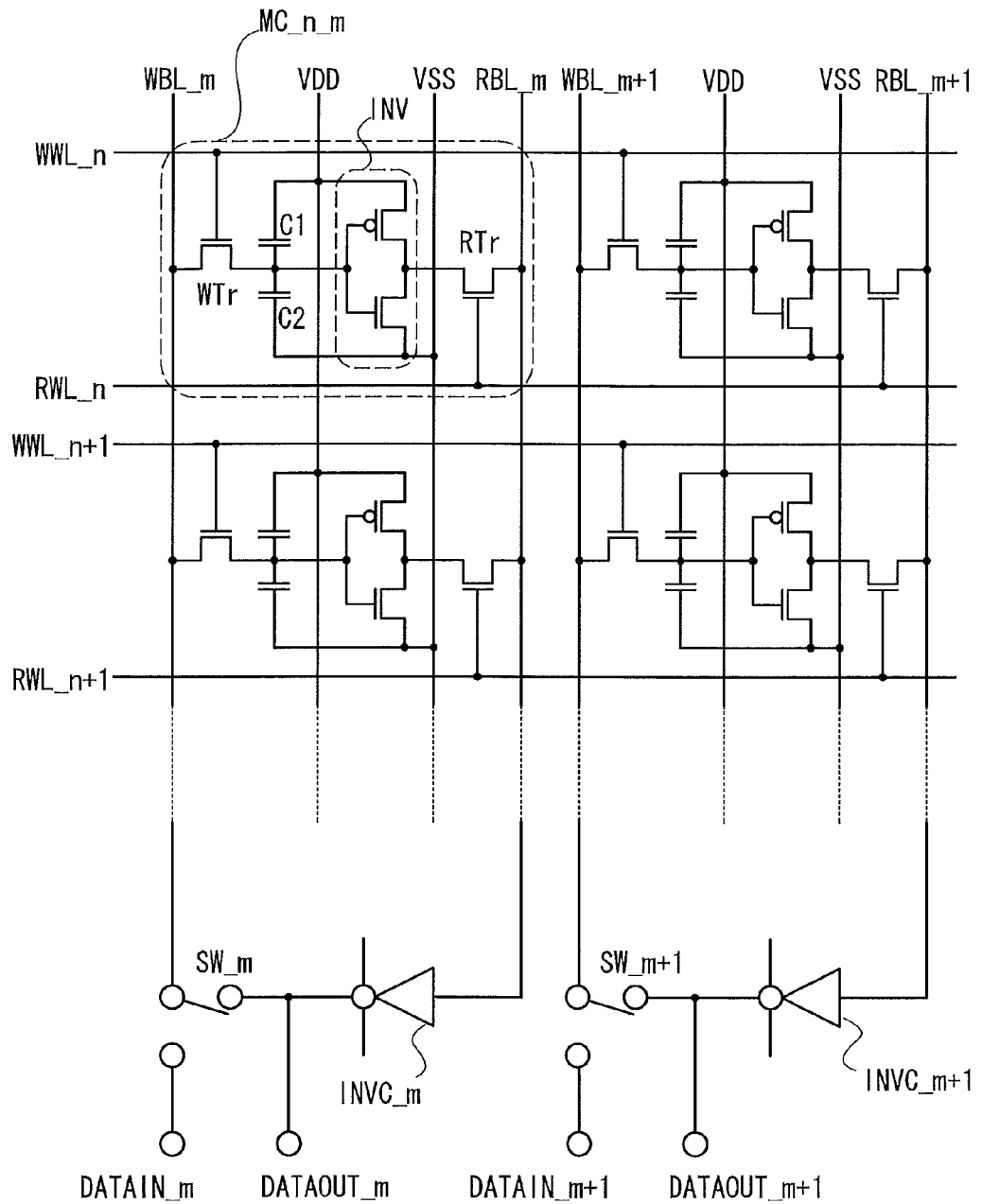
FIG. 1 illustrates an example of a semiconductor memory device of the present invention.

FIG. 1 illustrates a memory cell in the n-th row and m-th column, a memory cell in the (n+1)-th row and m-th column, a memory cell in the n-th row and the (m+1)-th column, and a memory cell in the (n+1)-th row and (m+1)-th column, and the write word lines WWL, read word lines RWL, write bit lines WBL, and read bit lines RBL which relate to these memory cells.

Each memory cell includes a write transistor WTr, a read transistor RTr, an inverter INV, and capacitors C1 and C2. The capacitor C1 or the capacitor C2, or both may be provided unintentionally.

The drain of the write transistor WTr is connected to the write bit line WBL. The drain of the read transistor RTr is connected to the read bit line RBL. The gate of the write transistor WTr is connected to the write word line WWL. The gate of the read transistor RTr is connected to the read word line RWL. Further, the source of the write transistor WTr is connected to the input of the inverter INV. The source of the read transistor RTr is connected to the output of the inverter INV. Here, a complementary inverter is used as the inverter.

In addition, a data input terminal DATAIN is disposed at one terminal of the write bit line WBL. It is acceptable that a column inverter INVC is provided to each column, the read bit line RBL is connected to the input of the column inverter INVC, and the write bit line WBL is connected to the output of the column inverter INVC. In this case, the memory device preferably employs, as illustrated in FIG. 1, a switch SW to select whether the write bit line WBL is connected to the data input terminal DATAIN or to the column inverter INVC. The output of the inverter may be connected to a data output terminal DATAOUT.

The read transistor RTr and the transistors forming the inverter can use various types of semiconductors. For example, all of those transistors can use the same semiconductor material. For example, those transistors may use a single crystal silicon semiconductor substrate.

The read transistors RTr and one or some of the transistors forming the inverter may use single crystal silicon semiconductor substrates, and the others of the transistors forming the inverter may use thin film semiconductor layers. In that case, the thin film semiconductor layers may use single crystalline silicon, polycrystalline silicon, or a semiconductor other than silicon, e.g., an oxide semiconductor.

Transistors using polycrystalline silicon have considerable threshold voltage variations and have therefore been difficult to use in the memory cells of the conventional SRAM which include flip-flop circuits. In contrast, in this embodiment, the memory cells do not include flip-flop circuits, so that some threshold voltage variations between the transistors forming the inverter INV are permissible, which enables the use of transistors using polycrystalline silicon for the memory cells.

Note that a semiconductor used for the write transistors WTr is one allowing the transistors to give a resistance of $1\times10^{18}\Omega$ or more, preferably $1\times10^{24}\Omega$ or more when being in the off-state. For example, one having a bandgap of three electron volts or more and a donor or acceptor concentration of $1\times10^{12}$ cm$^{-3}$ or less is used. For example, a compound of metal elements and oxygen where one of indium, zinc, and gallium accounts for 20% or more of the metal elements may be used.

In the semiconductor memory device in FIG. 1, the number of wires per one row (the number of write word lines WWL and read word lines RWL) is larger than that in the conventional SRAM by one. However, in the case where the write transistors WTr are formed in a different layer from the other transistors, the write word lines WWL can be formed in a different layer from the read word lines RWL, so that the increase in the number of wires does not lead to a decrease in the integration density.

The operation of the semiconductor memory device in FIG. 1 will be described with reference to FIGS. 3A to 3F. Note that, in the circuit diagrams showing operations in this specification, the symbol of a transistor in the off-state is crossed, while the symbol of a transistor in the on-state is circled. Here, the threshold voltage of an n-type transistor is +0.6 V, and the threshold voltage of a p-type transistor is -0.6 V.

The write operation will be first described. The potential of the gate of the read transistor RTr (i.e., the read word line RWL) is 0 V throughout the write operation. Here, the potential of the positive electrode of the inverter INV is +0.8 V, and the potential of the negative electrode is 0 V. Note that they may be at the same potential (0 V) instead. This is effective in reducing power consumption, but requires the consideration on input potential variations between the inverters during the read operation. During the write operation, the potential of the gate of the write transistor WTr (i.e., the write word line WWL) is +2 V.

Here, the case of writing data "1" will be described. In order to write data "1", the potential of the write bit line WBL is set to +0.8 V. The capacitor connected to the source of the write transistor (including the capacitors C1 and capacitor C2) is charged at this potential (see FIG. 3A).

Subsequently, the potential of the gate of the write transistor WTr is -2 V so that the resistance of the write transistor WTr is set to $1\times10^{18}\Omega$ or more, preferably $1\times10^{24}\Omega$ or more. Consequently, charge stored on the capacitor connected to the source of the write transistor WTr is held for an extremely long period of time (see FIG. 3B). This is the end of write operation.

Moreover, in this case, setting the potentials of the positive and negative electrodes of the inverter at the same potential (here, +0.8 V) can reduce power consumption. Since the capacitor connected to the source of the write transistor is disposed between the positive and negative electrodes of the inverter INV, a potential change of the positive or negative electrode causes a potential change of the source of the write transistor WTr. In other words, a decrease in the potential of the positive or negative electrode may reduce the potential of the source of the write transistor WTr and, particularly in the case where the applied potential is low, may reduce the resistance of the write transistor WTr.

Therefore, after the write operation, the potential of the positive or negative electrode of the inverter INV is preferably increased to set the potentials of the positive and negative electrodes equal. In the above-stated case, the potential of the negative electrode is increased from 0 V to +0.8 V to set the potentials of the positive and negative electrodes equal. This can keep the resistance of the write transistor WTr high.

When using a normal personal computer (which has a continuous operating time of several hours to several days), it is unnecessary to consider the loss of data due to the loss of charge from the capacitor connected to the source of the write transistor. For a device which has a continuous operating time of as much as several months or several years, such as a cellular phone, it is preferable that the refreshing operation is performed as appropriate.

For example, when the resistance of the write transistor WTr is set to $1\times10^{26}\Omega$ or more, data can be held for 10 years or more. An intrinsic semiconductor having a bandgap of three electron volts or more exhibits a thermal excitation carrier density of approximately $1\times10^{-7}$ cm$^{-3}$ at room temperature, so that the upper limit of the resistance is calculated to be $1\times10^{30}\Omega$ or more. In other words, reducing the donor concentration allows data to be held substantially permanently.

Next, the case of writing data "0" will be described. In order to write data "0", the potential of the write bit line WBL is set to -0.4 V while the potential of the gate of the write transistor WTr is set to +2 V. The capacitor connected to the source of the write transistor (including the capacitors C1 and capacitor C2) is charged at this potential (see FIG. 3C). Subsequently, the potential of the gate of the write transistor WTr is set to -2 V (see FIG. 3D). This is the end of the write operation.

During the process of retaining data, the potential of the gate of the write transistor WTr is preferably held at -2 V. Substantially, power consumption is not needed for keeping the potential of the gate of the write transistor WTr at a constant potential. Power consumption can be reduced by setting the potentials of the positive and negative electrodes of the inverter INV equal.

During the process of reading data, the potential of the positive electrode of the inverter INV is set to +0.8 V, and the potential of the negative electrode of the inverter INV is set to 0 V. Here, if data "1" is stored, the n-type transistor in the inverter INV is turned on, and the p-type transistor in the inverter INV is turned off and the potential of the read bit line RBL is 0V (see FIG. 3E). In contrast, if data "0" is stored, the p-type transistor in the inverter INV is turned on, and the n-type transistor in the inverter INV is turned off and the potential of the read bit line RBL is +0.8V (see FIG. 3F).

In addition, setting the potential of the gate of the read transistor to +2 V shortens the time for the read operation. Suppose now that the potential of the read bit line RBL is 0 V and data "0" is stored in the memory cell, as one example.

In the inverter INV, the p-type transistor is on and the output of the inverter is +0.8 V. However, the potential of the gate of the p-type transistor is −0.4 V and the potential of the source (the negative electrode of the inverter INV) of the p-type transistor is +0.8 V. Now, effective gate voltage is defined as ({potential difference between the gate and the source}−{threshold voltage})/k. The constant k is 1 for n-type transistors or −3 for p-type transistors, which reflects the fact that hole mobility is about one third of electron mobility in single crystal silicon. The effective gate voltage is useful for comparing the different conductivity type transistors. The higher the effective gate voltage is, the lower the resistance of the transistor is, and if the effective gate voltage of a p-type transistor is the same as that of an n-type transistor, the resistance of the p-type transistor is almost the same as that of the n-type transistor. The effective gate voltage of the above-stated p-type transistor is +0.2 V.

Note that when the potential of the gate of the read transistor RTr is set to +2 V, the effective potential difference of the read transistor RTr is +1.4 V. The fact that these two transistors differ greatly in their effective gate voltages means that they differ greatly in their resistances. Specifically, the resistance of the p-type transistor in the inverter INV is about seven times that of the read transistor RTr.

Such a great resistance difference causes the potential of the output of the inverter INV, albeit temporarily, to greatly decrease from +0.8 V toward 0 V at the moment when the read transistor RTr is turned on. If the potential of the output, albeit temporarily, decreases in this way, the flip-flop circuit may become unstable and its state may be inverted since the flip-flop circuit uses the output of one inverter as the input of the other inverter.

Therefore, to prevent the circuit from being unstable, the conventional SRAM using the flip-flop circuits for the memory cells takes measures of applying, in advance, a potential intermediate between the potentials of the positive and negative electrodes of the inverter to the bit line, or keeping the on-resistance of the selection transistor from exceeding the on-resistance of the p-type transistor in the inverter INV, for example.

In contrast, in the semiconductor memory device in FIG. 1, flip-flop circuits are not used for the memory cells, thereby preventing the circuit from being unstable even if the output potential of the inverter decreases. Rather, since the on-resistance of the read transistor RTr can be reduced as much as possible, the potential of the read bit line RBL can be set to a predetermined value (i.e., the output potential of the inverter) in a shorter time than in the conventional SRAM.

Figure 3A:
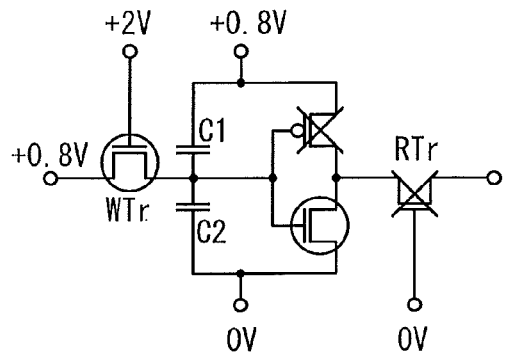
FIGS. 3A to 3F illustrate an example of a method of driving the semiconductor memory device of the present invention.
Figure 3B:
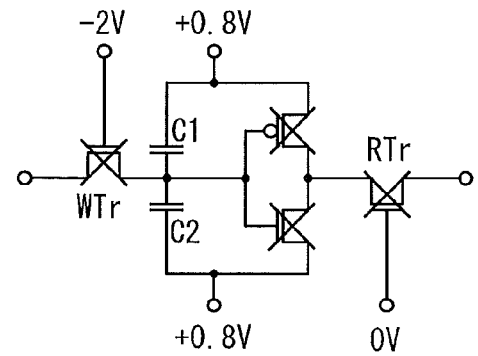
Figure 3C:
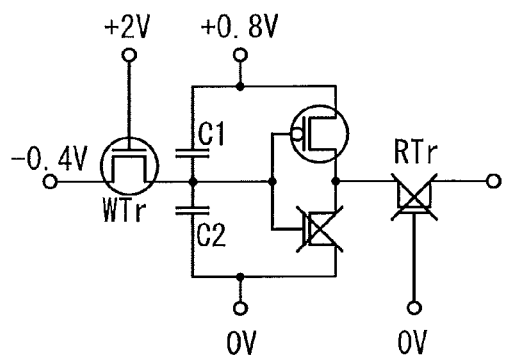
Figure 3D:
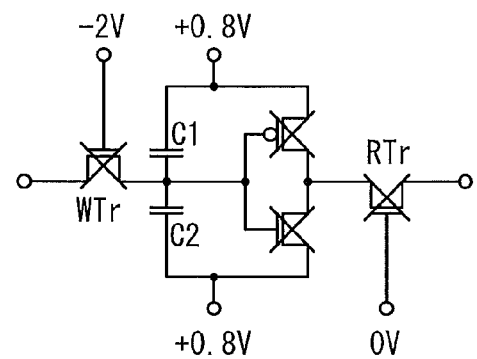
Figure 3E:
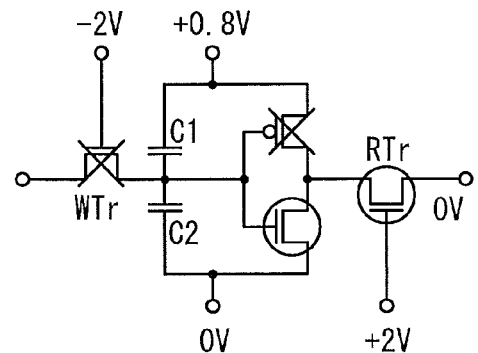
Figure 3F:
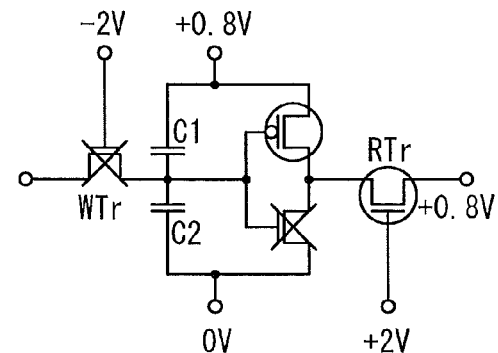

As seen from FIG. 3F, during the read operation, the resistance of this circuit depends mostly on the resistance of the p-type transistor in the inverter INV because, although the p-type transistor in the inverter INV and the read transistor RTr are connected in series, the resistance of the read transistor RTr is one seventh of that of the p-type transistor in the inverter INV.

Figure 2A:
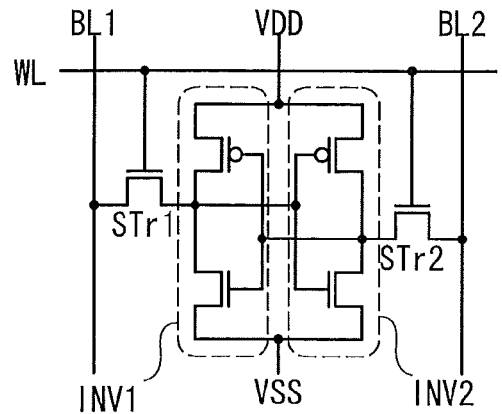
FIGS. 2A to 2C illustrate a memory cell in a conventional SRAM and examples of the characteristics of inverters.
Figure 2B:
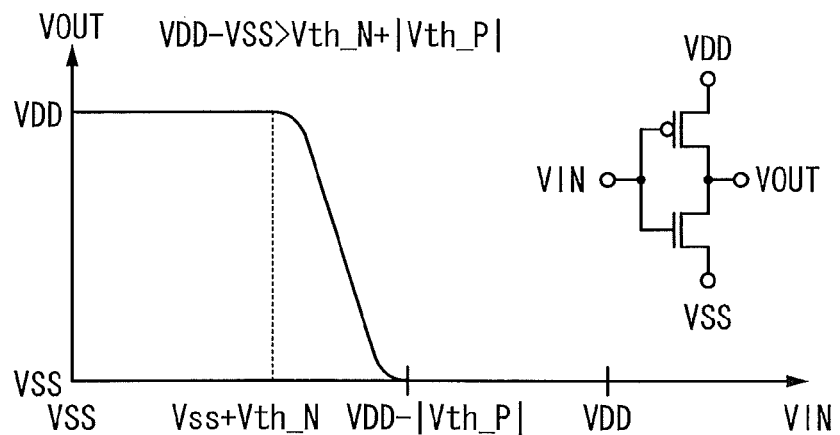
Figure 2C:
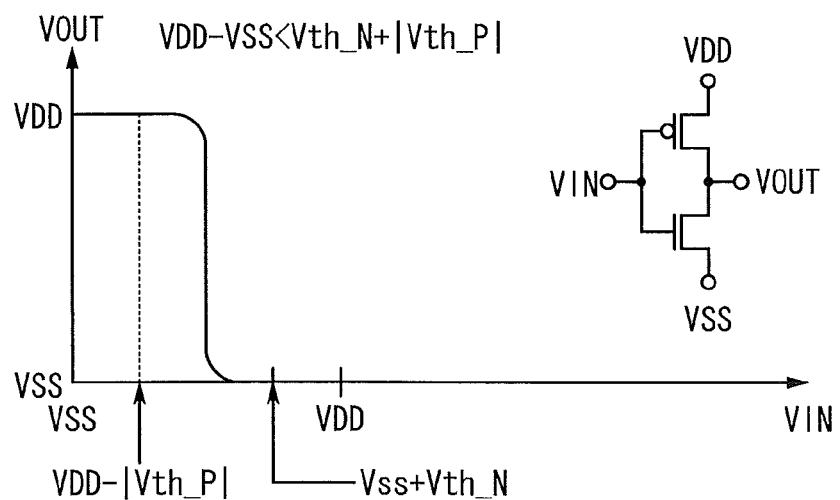

The memory cell in the conventional SRAM in FIG. 2A also has such a circuit configuration (the series circuit of the p-type transistor included in the inverter INV2 on the right and the selection transistor STr2). Even if the resistance of the p-type transistor in the inverter INV2 is assumed to be the same as in FIG. 3F, since the resistance of the selection transistor STr2 is set equal to that of the p-type transistor in the inverter INV2 for the purpose of preventing the circuit from being unstable, the resistance of this circuit is twice the resistance of the p-type transistor in the inverter INV2.

In other words, in the semiconductor memory device in this embodiment, the read operation can be performed with about half of the time length (to be exact, with a time length of $(1+\frac{1}{7})/2=0.57$)) for the read operation performed in the conventional SRAM.

In the above description, the effective gate voltage of the p-type transistor included in the inverter INV2 in the memory cell (see FIG. 2A) of the conventional SRAM is set to +0.2 V. To realize this, the potential difference between the positive and negative electrodes of the inverter INV2 needs to be 1.2V. In contrast, in the memory device in this embodiment the potential difference between the positive and negative electrodes of the inverter INV needs to be only 0.8V (see FIGS. 3E and 3F).

In this embodiment, the potential of the write bit line WBL is set to 0.8 V for writing data "1", whereas the potential of the write bit line WBL is set to −0.4 V for the writing data "0". Consequently, the effective gate voltage of the n-type transistor in the inverter INV is +0.2 V, and the effective gate voltage of the p-type transistor is +0.2 V as well.

In this embodiment, the potentials of the positive and negative electrodes of the inverter INV are set equal during the data retention period. With this method, power consumption hardly increases despite high leakage current between the positive and negative electrodes of the inverter INV.

Therefore, the current drive capability of the transistors may be increased by reducing the absolute values of the threshold voltages of the transistors forming the inverter as much as possible. For example, although the threshold voltage of the n-type transistor in the inverter is set to +0.6 V and that of the p-type transistor in the inverter is set to −0.6 V in the above description, if these are set to +0.3 V and −0.3 V, respectively, the operating speed is increased by 50%.

In this case, leakage current between the positive and negative electrodes of the inverter is increased by a factor of 10000. However, for an application in which the data retention period (the standby time) is much longer than the write or read operation period, such as a cellular phone, since the potentials of the positive and negative electrodes of the inverter can be set equal in the data retention period, power consumption due to such leakage current can be negligible.

By the way, for the conventional SRAM, as described above, the n-channel and p-channel transistors forming the inverter are different in their effective gate voltages. Therefore, in order to set currents flowing between the source and the drain while each transistor is in the on-state at the same level, the channel width of the p-channel transistor is generally set about third times that of the n-channel transistor. This means, however, that the area occupied by the memory cell increases.

In contrast, for the inverter in the semiconductor memory device in this embodiment, as described above, the effective gate voltages of the n-channel and p-channel transistors are set equal, so that currents flowing between the source and the drain in the on-state can be set at the same level. Consequently, unlike the conventional SRAM, the channel width of the p-channel transistor does not need to be set much larger than that of the n-channel transistor, so that the area of the memory cell can be reduced, which produces an advantage for a higher density of integration.

For example, in the inverter in the semiconductor memory device in this embodiment, the channel width of the p-channel transistor can be set to 0.5 to 2 times that of the n-channel transistor. Alternatively, the channel width of the p-channel transistor can be designed to be equal to that of the n-channel transistor. Alternatively, the channel width of the p-channel transistor can be processed to be the minimum line width.

Note that in the conventional SRAM, also the selection transistors, if without sufficient off-resistance, produce leakage current during the data retention period. In other words, leakage current flows from the memory cell whose p-type transistor is on to the memory cell whose n-type transistor is on through the bit lines and the selection transistors connected to these bit lines.

However, in this embodiment, the occurrence of such leakage current during the data retention period can be avoided by setting the potentials of the positive and negative electrodes of the inverter INV equal. For this reason, the current drive capability of the read transistor RTr can be increased by reducing the absolute value of the threshold voltage of the read transistor RTr as much as possible.

Note that the method of driving the semiconductor memory device in this embodiment hardly has a problem with writing or reading of data and can keep low power consumption even during the data retention period, even if the inverters INV and/or the read transistors RTr are formed using transistors with a high off-state current or transistors with considerable threshold voltage variations which results from short channel effect, statistical fluctuations in impurity concentration, or the like.

In the above-described case, potential difference of 0.8 V between the positive and negative electrodes of the inverter INV is intended to occur only during the write and read operations. However, the driving method in which the above-stated potential difference between the positive and negative electrodes of the inverter INV is intended to change frequently, i.e., at every write/read operation and data retention may need higher power consumption than the case where the above-stated potential difference between the positive and negative electrodes of the inverter INV is intended to be present at all times.

Therefore, when the read operation and the retention or the write operation and the retention are performed at short intervals (e.g., 1 μsec or less), the above-stated potential difference between the positive and negative electrodes of the inverter INV is preferably forced to be present at all times. Alternatively, for a while (e.g., 1 μsec or less) after the write or read operation, the storage may be performed while the above-stated potential difference between the positive and negative electrodes of the inverter INV is maintained, and then the potential difference may be set to 0.

Although in the above-stated case, the potential difference between the positive and negative electrodes of the inverter INV during the write and read operations is set to 0.8 V, the potential difference may be of another value. In general, increasing potential difference increases current drive capability, and thus is preferable for achieving high-speed write or read operation. However, increasing potential difference also increases leakage current, thereby raising power consumption during the write or read operation.

In the driving method in this embodiment, leakage current between the positive and negative electrodes of the inverter occurs only during the write and read operations; in the case where each of these periods is sufficiently shorter than (preferably, less than or equal to one ten-thousandth of) another periods (mainly data retention periods), there is no excessive increase in power consumption.

Embodiment 2

This embodiment will be described with reference to FIG. 1 and FIGS. 4A to 4C. In the writing method in Embodiment 1, during the write operation, the write transistor WTr is turned on by operating the write word line WWL, so that all the write transistors WTr connected to one write word line WWL are turned on. Consequently, charges stored on the capacitors connected to the sources of all the write transistors WTr in that row is lost.

This embodiment will give the description of a method in which data are rewritten to only, of the memory cells connected to the write word line WWL, ones in the columns that need to be rewritten, and the same data as those stored before are automatically written to the others.

Figure 4A:
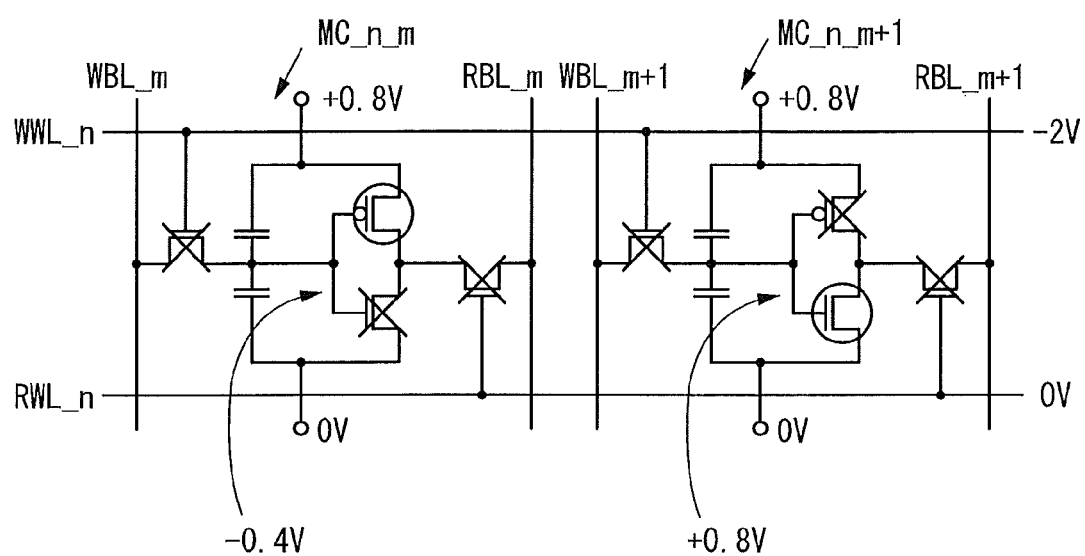
FIGS. 4A to 4C illustrate an example of a method of driving the semiconductor memory device of the present invention.
Figure 4B:
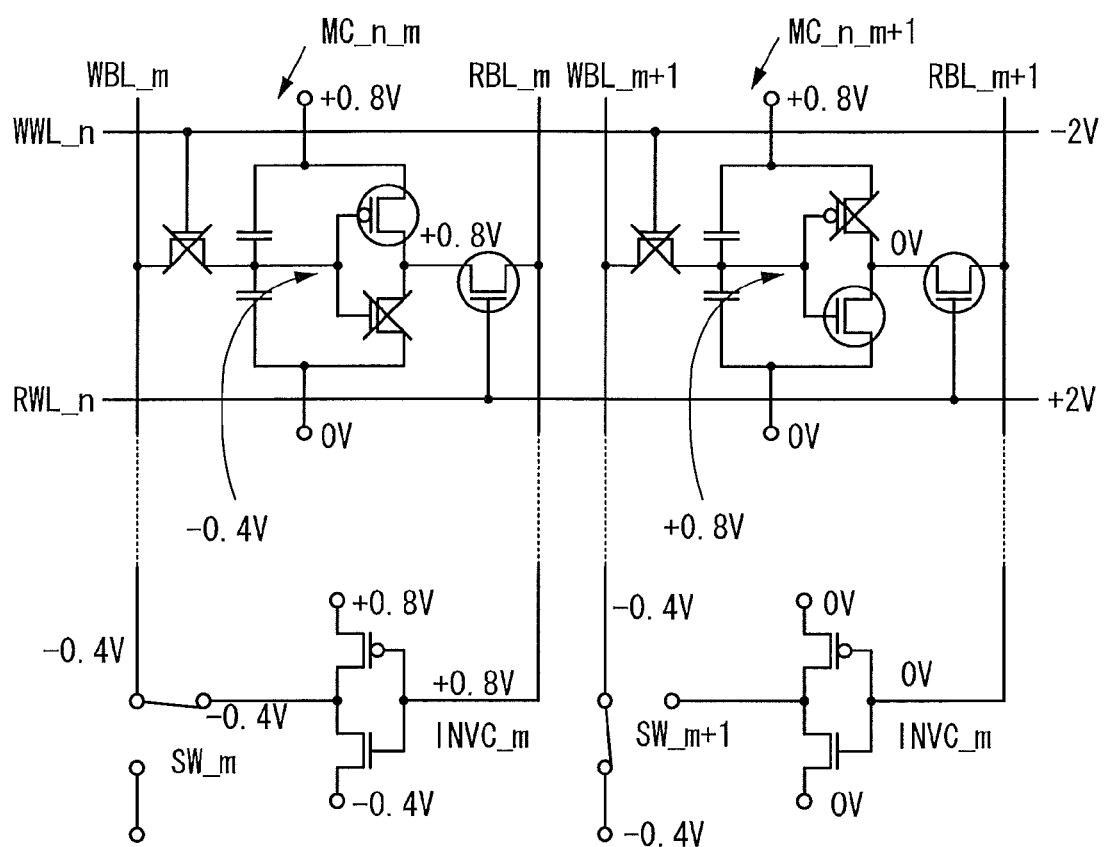
Figure 4C:
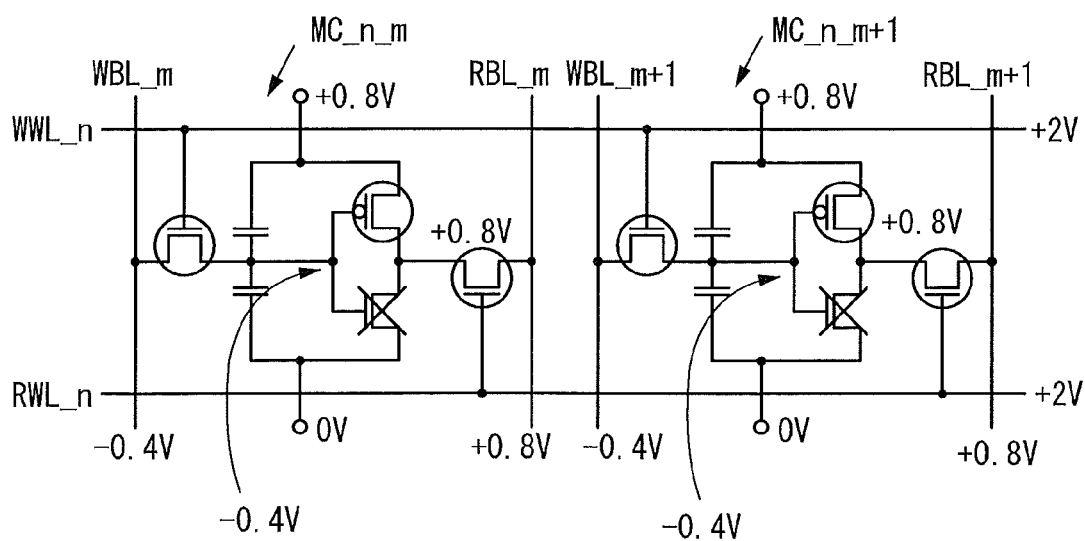

FIGS. 4A to 4C show an example. Here, the potential of the positive electrode of the inverter INV is +0.8 V, and the potential of the negative electrode of the inverter INV is 0 V. As illustrated in FIG. 4A, for the memory cell in the n-th row and the m-th column (MC_n_m), the input of the inverter INV_n_m is −0.4 V; for the memory cell in the n-th row and the (m+1)-th column (MC_n_m+1), the input of the inverter INV_n_m+1 is +0.8 V. In other words, data "0" is stored in the memory cell in the n-th row and the m-th column, and data "1" is stored in the memory cell in the n-th row and the (m+1)-th column.

Next, suppose that the data in the memory cell in the n-th row and the (m+1)-th column is changed into data "0", and the data in the memory cell in the n-th row and the m-th column is kept to be data "0". Then, in the m-th column that is not to be subjected to the rewrite operation, as illustrated in FIG. 4B, the potential of the positive electrode of the column inverter INVC_m is set to +0.8 V, and the potential of the negative electrode of the column inverter INVC_m is set to −0.4 V. Further, the write bit line WBL_m is connected to the column inverter INVC_m by the switch SW_m.

On the other hand, in the (m+1)-th column to be subjected to the rewrite operation, the switch SW_m+1 connects the write bit line WBL_m+1 to the data input terminal DATAIN_m+1. If the potentials of the positive and negative electrodes of the column inverter INVC_m+1 are set equal (e.g., 0 V), power consumption can be reduced. The potential of the data input terminal DATAIN_m+1 is set to a value according to new data (here, −0.4 V).

Further, the potential of the read word line RWL_n is set to +2 V to turn on the read transistor RTr_n_m and the read transistor RTr_n_m+1. Consequently, through the read bit line RBL_m, the output potential of the inverter INV_n_m included in the memory cell in the n-th row and the m-th column (+0.8 V) is input to the column inverter INVC_m, and a potential of −0.4 V is output from the column inverter INVC_m.

The write bit line WBL_m is connected to the output of the column inverter INVC_m through the switch SW_m, so that the potential of the write bit line WBL_m becomes −0.4 V.

The write bit line WBL_m+1 is connected to the data input terminal DATAIN_m+1 through the switch SW_m+1, so that the potential of the write bit line WBL_m+1 becomes −0.4 V as well.

Subsequently, the potential of the write word line WWL_n is set to +2 V to turn on the write transistor WTr_n_m and the write transistor WTr_n_m+1. At the same time, the potential of the read word line RWL_n can be set to 0 V to reduce power consumption. Thus, the capacitor connected to the source of each write transistor WTr is charged at the potential of the write bit line.

By this operation, the data in the memory cell in the n-th row and the m-th column is kept to be data "0" (specifically, the same data as before is written again), and the data in the memory cell in the n-th row and the (m+1)-th column is changed from "1" into "0".

Here, the operation of the column inverter INVC will be described. The potential applied to the column inverter INVC is either +0.8 V or 0 V. When a potential of +0.8 V is applied, the n-type transistor is turned on. When a potential of 0 V is applied, the p-type transistor is turned on.

However, when a potential of +0.8 V is applied, the effective gate voltage is +0.6V (=input potential (+0.8 V)–the potential of the negative electrode of the column inverter (−0.4V)–the threshold voltage of the n-type transistor (+0.6 V)). In contrast, when a potential of 0 V is applied, the effective gate voltage is +0.07 V (=(input potential (0 V)–the potential of the positive electrode of the column inverter (+0.8 V)–the threshold voltage of the p-type transistor (−0.6 V))/(−3)); thus, the on-resistance of the p-type transistor is about 10 times that of the n-type transistor when they have the same channel width.

Therefore, to achieve higher-speed response, it is preferable to increase the channel width of the p-type transistor in the column inverter INVC to an appropriate value thereby reducing the on-resistance of the p-type transistor. Unlike the inverter in the memory cell, the column inverter INVC is disposed in a column driver and limited in number, and thus eliminates the need to greatly increase the chip area for the semiconductor memory device.

Embodiment 3

In this embodiment, modified examples of the semiconductor memory device in FIG. 1 will be described with reference to FIGS. 5A to 5C. In the memory cell illustrated in FIG. 5A, the write bit line for the adjacent memory cell is used as a substitute of the read bit line. In other words, the bit line BL_m+1 is the read bit line for the memory cell in the n-th row and the m-th column (MC_n_m) and also the write bit line for the memory cell in the n-th row and the (m+1)-th column.

Figure 5A:
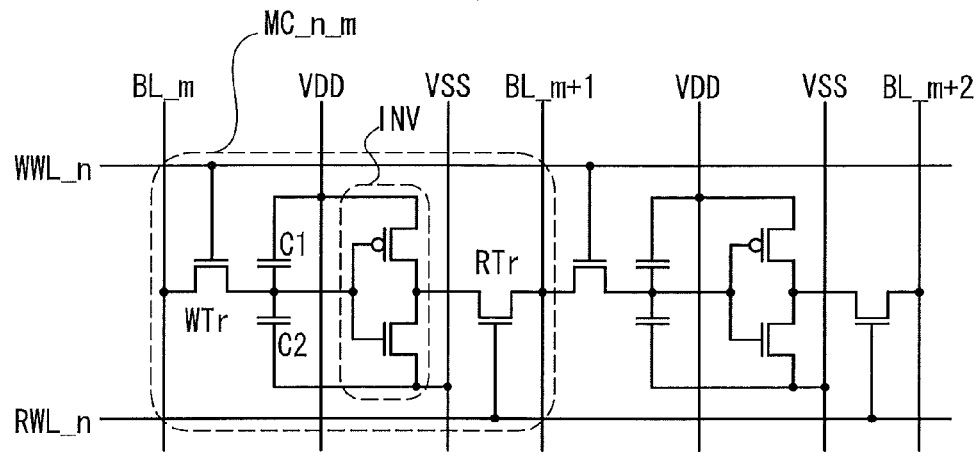
FIGS. 5A to 5C illustrate examples of the semiconductor memory device of the present invention.
Figure 5B:
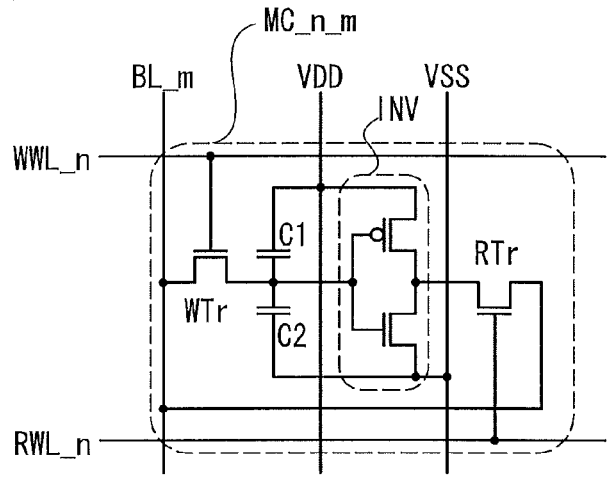

In the memory cell in FIG. 5B, the write bit line used for this memory cell is a substitute of the read bit line. In other words, the bit line BL_m the read bit line for the memory cell in the n-th row and the m-th column and also the write bit line used for this memory cell.

Figure 5C:
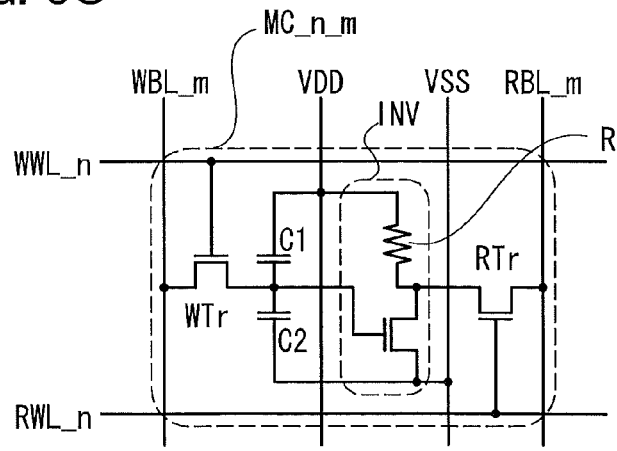

The memory cell in FIG. 5C is one in which the inverter is not a complementary inverter but a resistive load inverter. In other words, a resistor R is used instead of the p-type transistor in the inverter INV_n_m included in the memory cell in the n-th row and the m-th column which is illustrated in FIG. 1. The resistor R can be a thin film, and thus can be stacked over another component such as a transistor, increasing integration density.

In a resistive load inverter, leakage current between the positive and negative electrodes can be higher than that in a complementary inverter. However, as stated in Embodiment 1, during the data retention period, setting the potentials of the positive and negative electrodes of the inverter equal eliminates leakage current. Therefore, during the data retention period, the complementary inverter and the resistive load inverter consume the same amount of power. Note that, during the read operation, the resistive load inverter has a lower operating speed and a higher power consumption than the complementary inverter.

The memory cell in FIG. 5C, which employs a resistor R instead of the p-type transistor in the inverter INV_n_m illustrated in FIG. 1, may employ a resistor. Instead of the n-type transistor. Either a diode (including a diode-connected transistor) or depletion transistor can be used instead of the resistor.

In the memory cell in FIG. 5A also, as stated in Embodiment 2, only selected memory cells in one row are rewritten, and the other memory cells can hold the same data.

Assume, for example, that, in the initial state, data "0" is stored on the memory cell in the n-th row and the m-th column illustrated in FIG. 5A, and data "1" is stored on the memory cell in the n-th row and the (m+1)-th column. Suppose now that only the data on the memory cell in the n-th row and the (m+1)-th column is then changed into data "0".

Figure 6A:
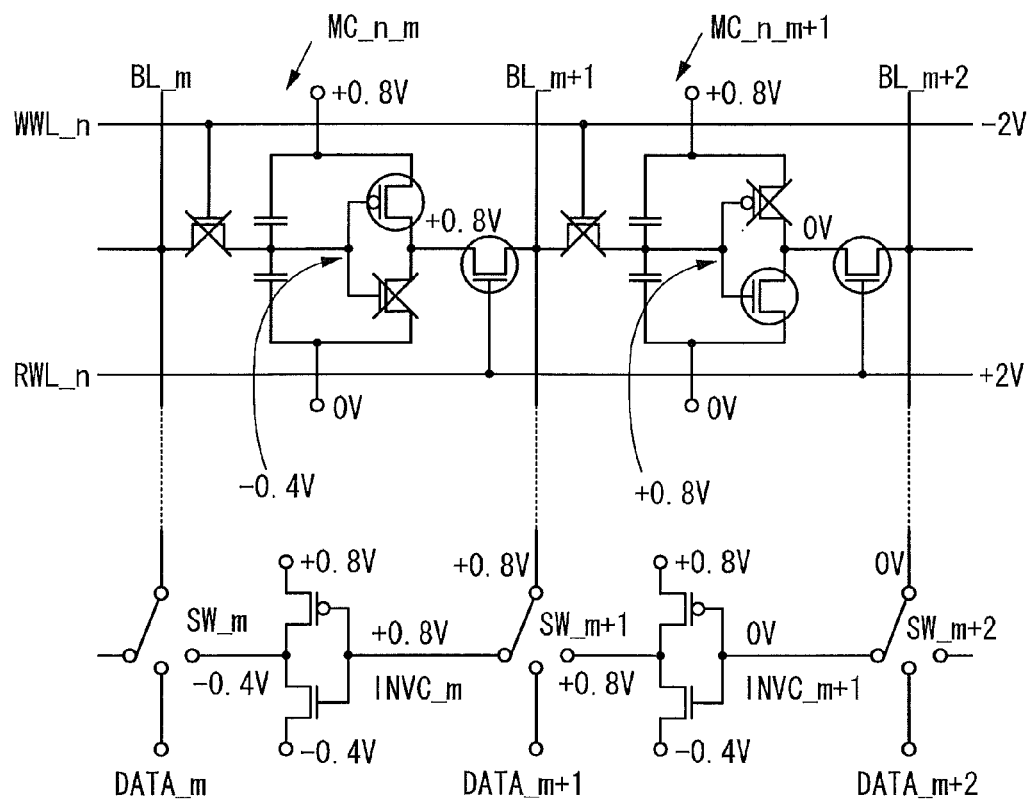
FIGS. 6A and 6B illustrate an example of a method of driving the semiconductor memory device of the present invention.

In order to perform such operation, as illustrated in FIG. 6A, the switch SW_m, the switch SW_m+1, and the switch SW_m+2 are disposed at one terminals of the bit line BL_m, the bit line BL_m+1, and the bit line BL_m+2, respectively. The switches SW shown here are preferably transistors, diodes, or the like. In addition, these switches are abstract expressions for understanding of the circuit configuration, and may therefore be different from those in an actual circuit configuration.

For example, one of the terminals of the switch SW_m+1 is connected to the input of the column inverter INVC_m; another one, to the output of the column inverter INVC_m+1; the last one, to the data input output terminal DATA_m+1.

The read operation is performed prior to the write operation. In this process, each switch SW connects the bit line BL to the input of the column inverter INVC in the previous column to temporarily retain the stored data (see FIG. 6A).

In addition, the potential of the positive electrode of the inverter INV in each memory cell is set to +0.8 V; the potential of the negative electrode of the inverter INV in each memory cell, to 0 V; the potential of the read word line RWL_n, to +2 V, so that the read transistors RTr_n_m and RTr_n_m+1 are turned on. Consequently, the potential of the bit line BL_m+1 becomes +0.8 V and the potential of the bit line BL_m+2 becomes 0 V.

These potentials are the input potentials of the column inverter INVC; thus, when the potential of the positive electrode of the column inverter is set to +0.8 V and the potential of the negative electrode is set to −0.4 V, the output of the column inverter INVC_m and the output of the column inverter INVC_m+1 become −0.4 V and +0.8 V, respectively. Note that, to reduce power consumption, the potentials of the positive and negative electrodes of the column inverter INVC_m+1 in the column to be subjected to the write operation may be set equal.

Figure 6B:
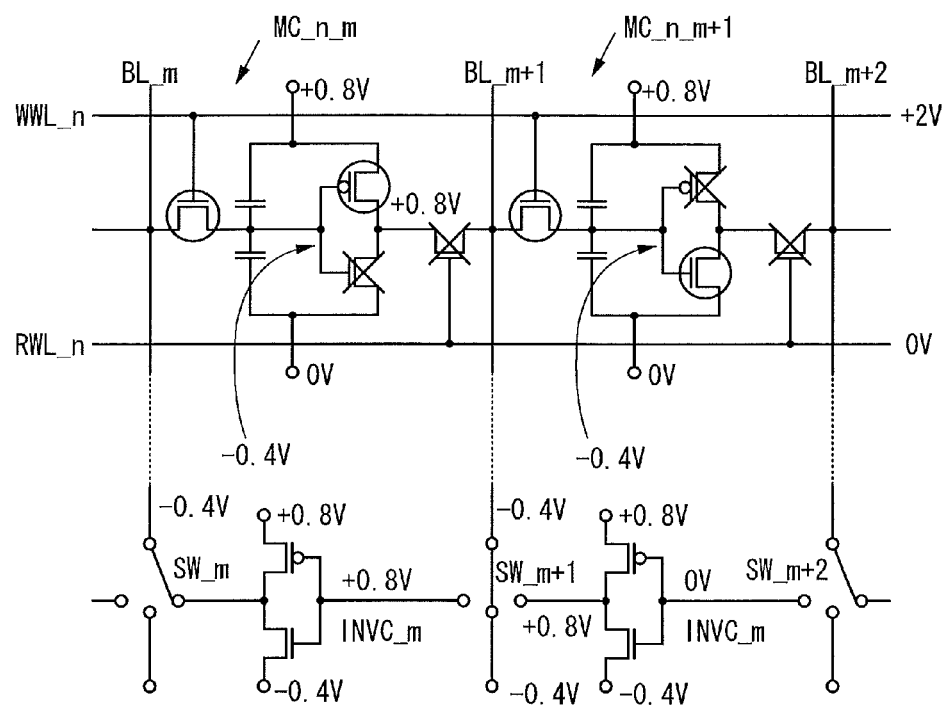

Next, the switch SW_m+1 in the column to be subjected to the write operation connects the bit line BL_m+1 to a data input output terminal DATA_m+1, and the switch SW_m in the column that is not subjected to the write operation connects the bit line BL_m to the column inverter INVC_m (see FIG. 6B). The potential of the data input output terminal DATA_m+1 is set to −0.4 V.

Consequently, the potential of the bit line BL_m becomes −0.4 V which is the output potential of the column inverter INVC_m and the potential of the bit line BL_m+1 becomes −0.4 V which is the potential of the data input output terminal DATA_m+1. Subsequently, the potential of the read word line RWL_n is set to 0 V and the potential of the write word line WWL_n is set to +2 V, so that the read transistors RTr_n_m and RTr_n_m+1 are turned off and the write transistors WTr_n_m and WTr_n_m+1 are turned on, thereby setting the potentials of the capacitors connected to the source of the write transistors WTr to a predetermined value.

By this operation, the potential of the capacitor connected to the source of the write transistor WTr_n_m is set to −0.4 V which is the same as the initial value, but the potential of the capacitor connected to the source of the write transistor WTr_n_m+1 is changed from +0.8V, the initial value, into −0.4 V. In this way, the memory cells to be rewritten can be given a predetermined data, and the memory cells that are not to be rewritten can retain the initial data.

Figure 9A:
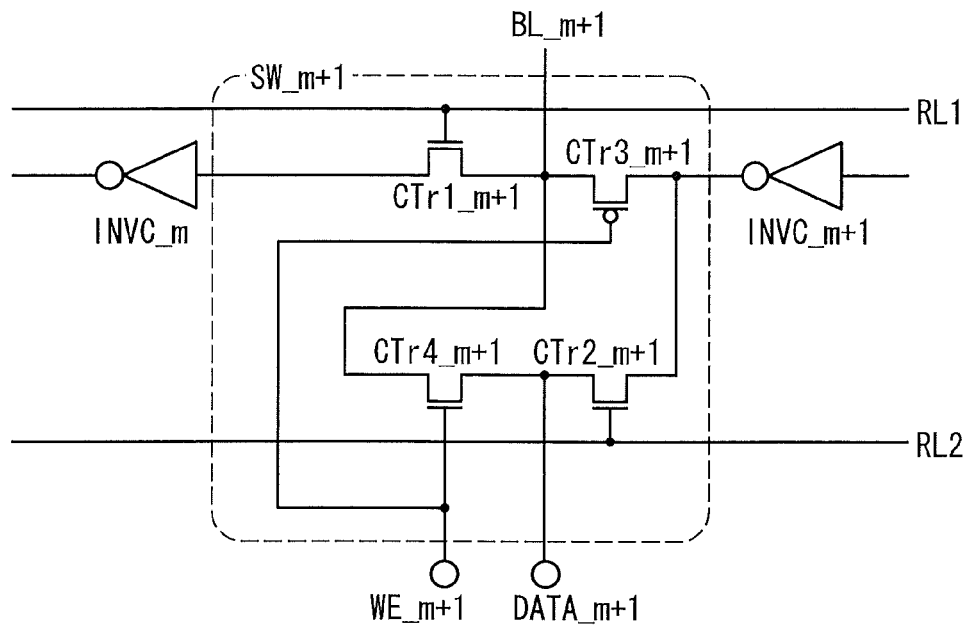
FIGS. 9A and 9B illustrate examples of a semiconductor memory device of the present invention.

FIG. 9A illustrates an example of the circuit configuration of the switch SW_m+1. The switch SW_m+1 includes a first column transistor CTr1_m+1, a second column transistor CTr2_m+1, a third column transistor CTr3_m+1 and a fourth column transistor CTr4_m+1. The first column transistor CTr1_m+1 and the second column transistor CTr2_m+1 are controlled by a first column driver line RL1 and a second column driver line RL2, respectively.

Both the third column transistor CTr3_m+1 and the fourth column transistor CTr4_m+1 are controlled by a write signal terminal WE_m+1. The fourth column transistor CTr4_m+1 is in the on-state when the third column transistor CTr3_m+1 is in the off-state while the third column transistor CTr3_m+1 is in the on-state when the fourth column transistor CTr4_m+1 is in the off-state since the conductivity type of the third column transistor CTr3_m+1 is different from that of the fourth column transistor CTr4_m+1 (the third column transistor CTr3_m+1 is p-type and the fourth column transistor CTr4_m+1 is n-type in FIG. 9A).

In the step described with reference to FIG. 6A, the switch SW_m+1 connects the bit line BL_m+1 to the input of the column inverter INVC_m regardless of whether the memory cell is rewritten or not. To achieve this, the potentials of the first column driver line RL1, the second column driver line RL2, and the write signal terminal WE_m+1 are controlled so as to turn on the first column transistor CTr1_m+1 and to turn off the second column transistor CTr2_m+1 and the third column transistor CTr3_m+1. As a result, the bit line BL_m+1 and the input of the column inverter INVC_m can be connected to each other.

Note that in this operation the fourth column transistor CTr4_m+1 is turned on and the bit line BL_m+1 and the data input output terminal DATA_m+1 are connected to each other, but the BL_m+1 and the column inverter INVC_m+1 are insulated from each other.

In the circuit illustrated in FIG. 9A, the data input output terminal DATA_m+1 can function as the data input terminal and also as the data output terminal. In order to perform the read operation, the potential of the second column driver line RL2 is controlled to turn on the second column transistor CTr2_m+1. Further, the first column transistor CTr1_m+1 is turned off. As a result, the output of the column inverter INVC_m+1 and the data input output terminal DATA_m+1 are connected to each other.

Note that in this operation, the third column transistor CTr3_m+1 may be turned on or off (and the fourth column transistor CTr4_m+1 may be turned off or on), but in either case the bit line BL_m+1 and the column inverter INVC_m+1 are connected to each other while the bit line BL_m+1 and the column inverter INVC_m are insulated from each other.

In order to perform the rewrite operation, the potential of the data input output terminal DATA_m+1 is set in accordance with new data, and at the same time, the fourth column transistor CTr4_m+1 is turned on by controlling the potential of the write signal terminal WE_m+1. Further both the first column transistor CTr1_m+1 and the second column transistor CTr2_m+1 are turned off by controlling the potentials of the first column driver line RL1 and the second column driver line RL2. Note that also the third column transistor CTr3_m+1 is turned off.

As a result, the data input output terminal DATA_m+1 and the bit line BL_m+1 are connected to each other, and the potential of the bit line BL_m+1 becomes one according to the potential of the data input output terminal DATA_m+1.

In contrast, when the rewrite operation is not performed, the third column transistor CTr3_m+1 is turned on and the first column transistor CTr1_m+1, the second column transistor CTr2_m+1 is turned off. Note that also the fourth column transistor CTr4_m+1 is turned off. Consequently, the column inverter INVC_m+1 and the bit line BL_m+1 are connected to each other, and the potential of the bit line BL_m+1 becomes the potential of the same phase as the potential of the column inverter INVC_m+1.

Figure 9B:
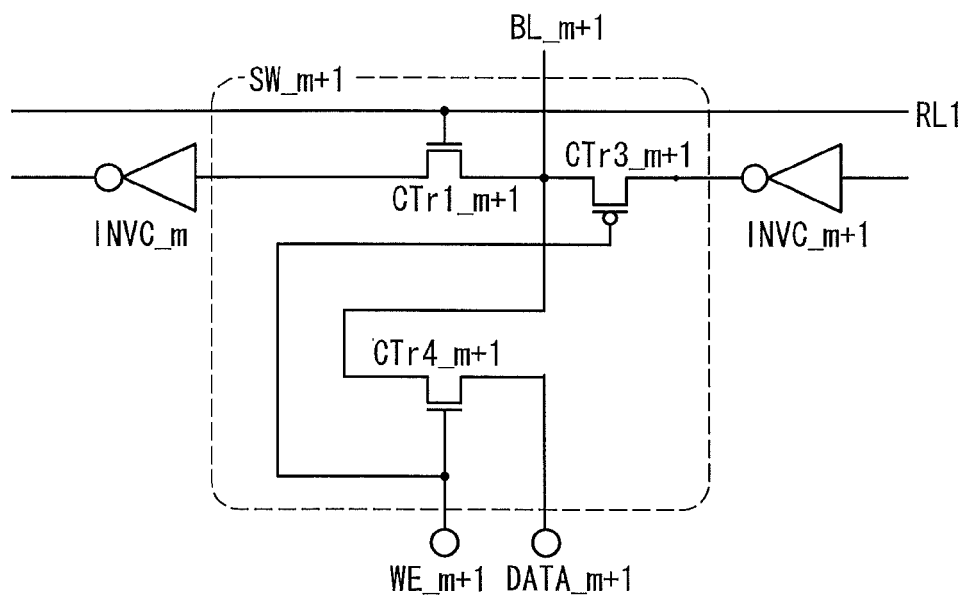

Note that a circuit without the second column transistor CTr2 can be used as the switch SW, as shown in FIG. 9B. To connect the bit line BL_m+1 to the input of the column inverter INVC_m in this circuit, the first column transistor CTr1_m+1 is turned on while the third column transistor CTr3_m+1 is turned off. At this time the fourth column transistor CTr4_m+1 is turned on and the bit line BL_m+1 and the data input output terminal DATA_m+1 are connected to each other.

To read the data, the potential of the data input output terminal DATA_m+1 may be measured. Note that the measured potential here is corresponding to that of the data of memory cell in the m-th column and that of the inverted phase to the original data.

If a rewrite operation is required, the first column transistor CTr1_m+1 and the third column transistor CTr3_m+1 are turned off. At this time, the fourth column transistor CTr4_m+1 is turned on and the bit line BL_m+1 and the data input output terminal DATA_m+1 are connected to each other. The rewrite operation can be performed by setting the potential of the data input output terminal DATA_m+1 to that according to the data.

If a rewrite operation is not required, the first column transistor CTr1_m+1 and the fourth column transistor CTr4_m+1 are turned off. At this time, the third column transistor CTr3_m+1 is turned on. The column inverter INVC_m+1 and the bit line BL_m+1 are connected to each other and the same data as before are rewritten.

Embodiment 4

Examples of the structures and an example of the method for fabricating the memory cells in the semiconductor memory device will be described with reference to FIGS. 7A to 7D and FIGS. 8A to 8F. FIGS. 8A to 8F each illustrate the plane structures of the main layers in the memory cell. FIGS. 7A to 7D are cross-sectional views each showing section A-B in FIG. 8A. In this embodiment, a memory cell in which one bit line can function as a write bit line and read bit line in the same column (FIG. 5B) will be described. FIGS. 8A to 8F each illustrate four memory cells.

Figure 7A:
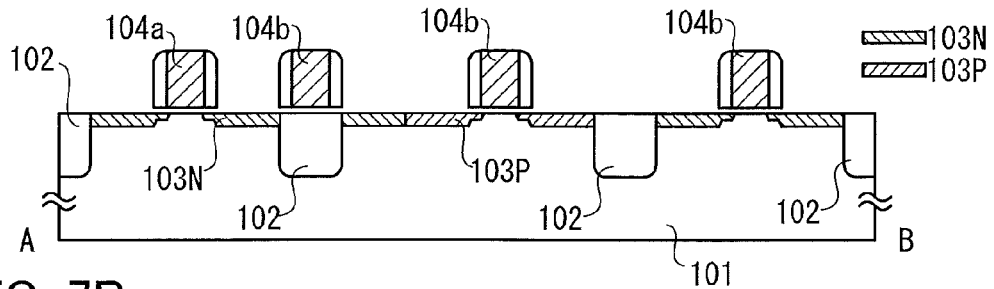
FIGS. 7A to 7D illustrate an example of a process of manufacturing the semiconductor memory device of the present invention.
Figure 8A:
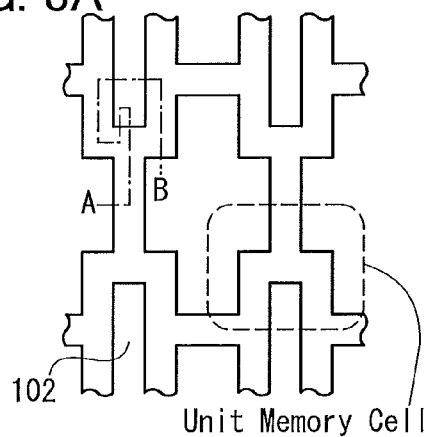
FIGS. 8A to 8F illustrate an example of the process of manufacturing the semiconductor memory device of the present invention.

First, element isolation insulators 102 and p-type and n-type wells (not illustrated) are formed on one surface of a substrate 101 of a single crystal semiconductor such as silicon or gallium arsenide by a known semiconductor processing technique (see FIG. 8A). Moreover, n-type impurity regions 103N, p-type impurity regions 103P, and first layer wires 104a and 104b are formed (see FIG. 7A and FIG. 8B).

Note that silicide layers having a thickness of 100 nm to 500 nm is preferably disposed on the surfaces of the n-type impurity regions 103N and p-type impurity regions 103P by a known self-aligned silicide (SALICIDE) technique. The silicide layer allows a drain of the n-type transistor and a drain of the p-type transistor to be connected to each other without any wire or the like.

Figure 8B:
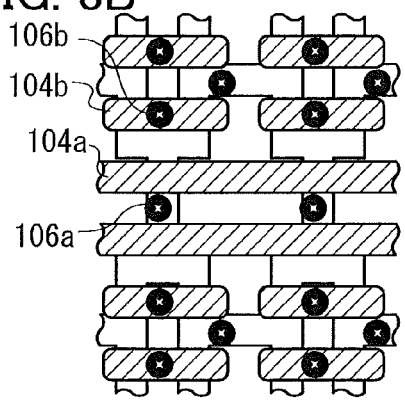

FIG. 7A illustrates three first layer wires 104b; they are a plurality of sections of the first layer wire 104b illustrated in FIG. 8B. The first layer wire 104a serves as a read word line. The first layer wire 104b serves as the gate of the inverter in the memory cell.

Figure 8C:
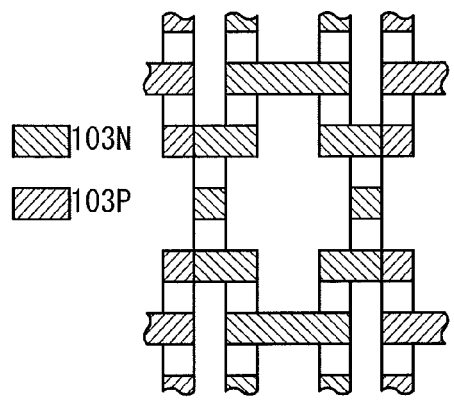

Plane views of the n-type impurity regions 103N and the p-type impurity regions 103P are illustrated in FIG. 8C. Although some of the n-type impurity regions 103N and some of the p-type impurity regions 103P are in contact with each other in some portions, the above-stated silicide layers can provide a good electrical connection even in these portions. For simplicity, the n-type impurity regions 103N and the p-type impurity regions 103P are not illustrated in FIGS. 8A to 8F except in FIG. 8C.

Figure 7B:
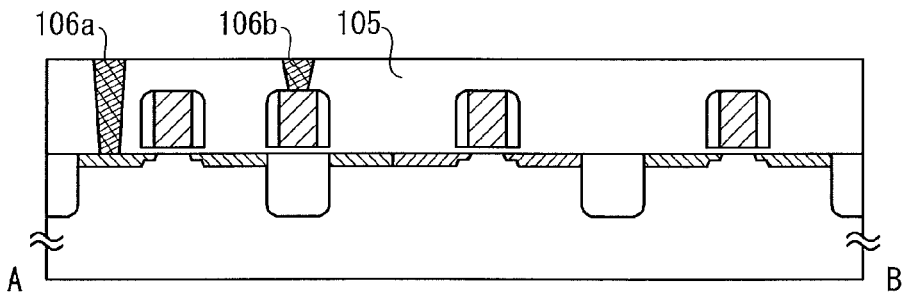

Next, a first interlayer insulator 105 is formed and first contact plugs 106a and 106b are formed (see FIG. 7B and FIG. 8B).

Figure 7C:
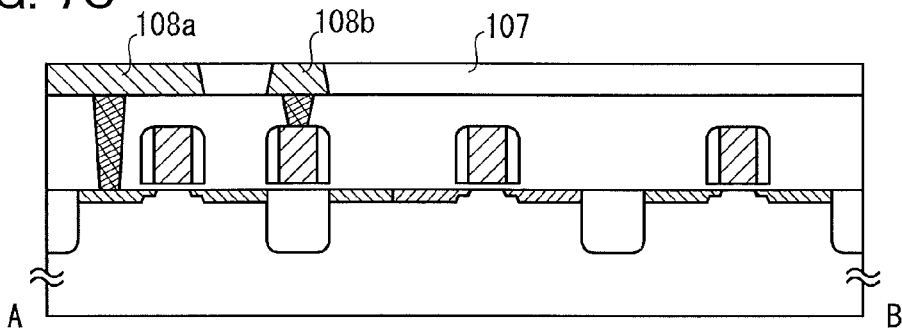
Figure 8D:
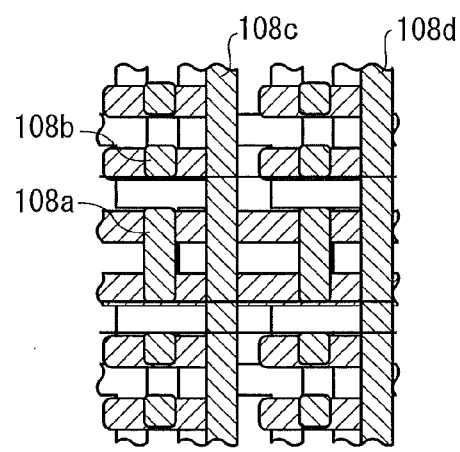

Further, embedment insulators 107 and second layer wires 108a to 108d are formed (see FIG. 7C and FIG. 8D). The second layer wires 108a to 108d may be of copper for an increase in conductivity. In that case, the second layer wires 108a to 108d are preferably manufactured by a damascene method. Note that top surfaces of the second layer wires 108a to 108d are to be in contact with an oxide semiconductor subsequently formed; thus, the second layer wires preferably use a material suitable for this purpose. For example, a material whose work function is less than the electron affinity of the oxide semiconductor, such as titanium or titanium nitride, is preferably used.

Here, the second layer wires 108a serve as the drains of the write transistors in the memory cell, and the second layer wires 108b serve as the sources of the write transistors in the memory cell. Further, the second layer wires 108c and 108d are used for supplying potential to the positive and negative electrodes of the inverter, respectively. The second layer wires 108c and 108d are disposed to be orthogonal to the word line, so that the inverters can be controlled in each memory cell.

Figure 7D:
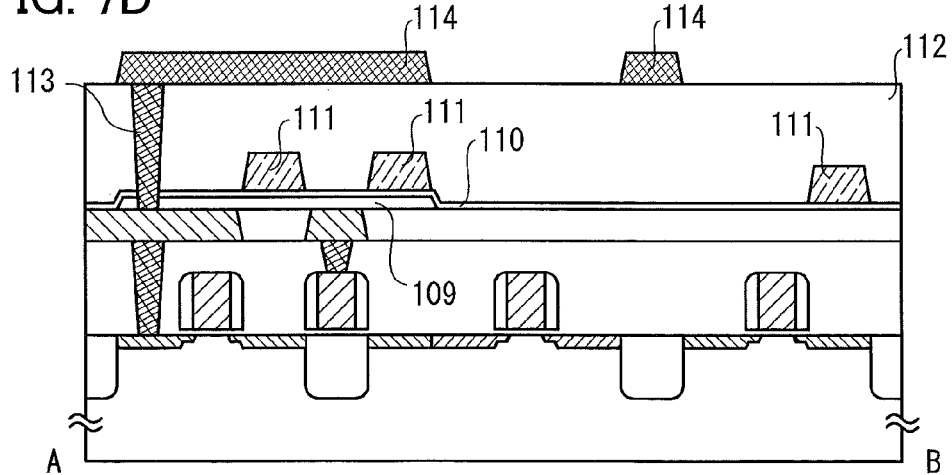

Subsequently, oxide semiconductor layers 109 are formed as illustrated in FIG. 7D. An oxide semiconductor in which indium accounts for 20 at. % or more of all metal elements is preferably used. At the time of the formation, attention needs to be paid to avoid the entry of hydrogen, and the oxide semiconductor is preferably deposited by sputtering where hydrogen and water in the atmosphere or in the target are sufficiently reduced.

Then, a gate insulator 110 is formed. Examples of materials for the gate insulator 110 include silicon oxide, silicon oxynitride, aluminum oxide, hafnium oxide, and zirconium oxide. The thickness of the gate insulator 110 is preferably 6 nm to 20 nm, more preferably 10 nm to 16 nm.

Figure 8E:
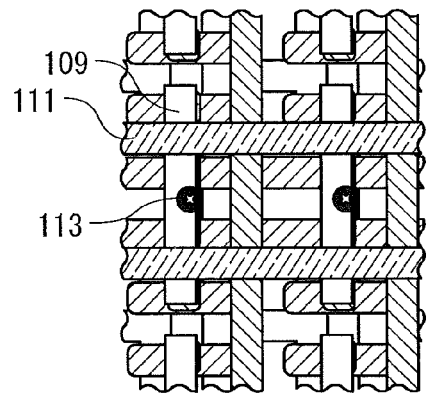

Then, third layer wires 111 are formed (see FIG. 8E). The third layer wire 111 serves as a write word line. A preferable material for the third layer wires 111 is a material whose work function is greater than the electron affinity of the oxide semiconductor, such as tungsten, nickel, palladium, osmium, or platinum; or a material whose work function is 5 eV or more. It is acceptable that only part of the third layer wires 111 which is in contact with the gate insulator 110 is of such a material. Next, a second interlayer insulator 112 and second contact plugs 113 are formed (see FIG. 8E).

Figure 8F:
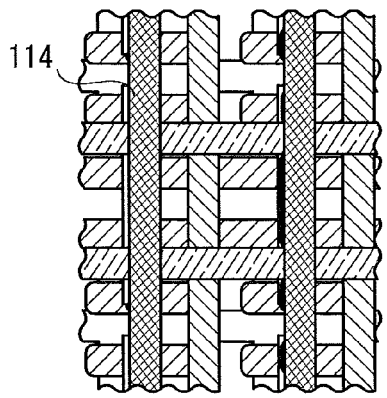

Then, fourth layer wires 114 are formed (see FIG. 7D and FIG. 8F). The fourth layer wire 114 functions as a bit line. The above-described memory cell has an area of 20 $F^2$ (note that F is the minimum feature size), which means this cell has very high density of integration compared with the conventional SRAM (in which one memory cell has an area of 40 $F^2$ or more).

This application is based on Japanese Patent Application serial no. 2010-238609 filed with Japan Patent Office on Oct. 25, 2010, the entire contents of which are hereby incorporated by reference.

What is claimed is:

1. A semiconductor memory device comprising:
one or more bit lines;
one or more write word lines;
one or more read word lines;
one or more memory cells; and
a first inverter,
wherein each of the memory cells comprises a write transistor, a read transistor, and a second inverter,
wherein a maximum resistance of the write transistor is $1\times10^{18}\Omega$ or more,
wherein one of a source and a drain of the write transistor is connected to one of the bit lines,
wherein one of a source and a drain of the read transistor is connected to another of the bit lines,
wherein the other of the source and the drain of the write transistor is connected to an input of the second inverter,
wherein the other of the source and the drain of the read transistor is connected to an output of the second inverter,
wherein a gate of the write transistor is connected to the write word line,
wherein a gate of the read transistor is connected to the read word line,
wherein the one of the bit lines is configured to connected to an input of the first inverter, and
wherein an output of the first inverter is connected to the another of the bit lines.

2. The semiconductor memory device according to claim 1, wherein the other of the source and the drain of the write transistor is connected to one electrode of a capacitor.

3. The semiconductor memory device according to claim 1, wherein the second inverter is a complementary inverter.

4. The semiconductor memory device according to claim 1, wherein conductivity type of the read transistor is different from conductivity type of the write transistor.

5. The semiconductor memory device according to claim 1, wherein the write transistor and the read transistor are disposed in different layers.

6. The semiconductor memory device according to claim 1, wherein the write transistor and one transistor included in the second inverter are disposed in different layers.

7. The semiconductor memory device according to claim 1, wherein semiconductor for the write transistor and semiconductor for the read transistor are of different kinds.

8. The semiconductor memory device according to claim 1, wherein semiconductor for the write transistor and semiconductor for one transistor included in the second inverter are of different kinds.

9. A method of driving the semiconductor memory device according to claim 1, wherein a potential difference between positive and negative electrodes of the second inverter is set to 0.1 V or less during a data retention period.

10. A method of driving the semiconductor memory device according to claim 1, wherein, during reading of data, an input potential of the second inverter is higher than a potential of the positive electrode of the second inverter or lower than a potential of the negative electrode of the second inverter.

11. A semiconductor memory device comprising:
a first bit line and a second bit line;
a write word line;
a read word line;
a memory cell; and
a first inverter,
wherein the memory cell comprises a write transistor, a read transistor, and a second inverter,
wherein a maximum resistance of the write transistor is $1\times10^{18}\Omega$ or more,
wherein one of a source and a drain of the write transistor is connected to the first bit line,
wherein one of a source and a drain of the read transistor is connected to the second bit line,
wherein the other of the source and the drain of the write transistor is connected to an input of the second inverter,
wherein the other of the source and the drain of the read transistor is connected to an output of the second inverter,
wherein a gate of the write transistor is connected to the write word line,
wherein a gate of the read transistor is connected to the read word line,
wherein the second bit line is configured to connected to an input of the first inverter, and
wherein an output of the first inverter is configured to connected to the first bit line.

12. The semiconductor memory device according to claim 11, wherein the other of the source and the drain of the write transistor is connected to one electrode of a capacitor.

13. The semiconductor memory device according to claim 11, wherein the second inverter is a complementary inverter.

14. The semiconductor memory device according to claim 11, wherein conductivity type of the read transistor is different from conductivity type of the write transistor.

15. The semiconductor memory device according to claim 11, wherein the write transistor and the read transistor are disposed in different layers.

16. The semiconductor memory device according to claim 11, wherein the write transistor and one transistor included in the second inverter are disposed in different layers.

17. The semiconductor memory device according to claim 11, wherein semiconductor for the write transistor and semiconductor for the read transistor are of different kinds.

18. The semiconductor memory device according to claim 11, wherein semiconductor for the write transistor and semiconductor for one transistor included in the second inverter are of different kinds.

19. A method of driving the semiconductor memory device according to claim 11, wherein a potential difference between positive and negative electrodes of the second inverter is set to 0.1 V or less during a data retention period.

20. A method of driving the semiconductor memory device according to claim 11, wherein, during reading of data, an input potential of the second inverter is higher than a potential of the positive electrode of the second inverter or lower than a potential of the negative electrode of the second inverter.

* * * * *